(12) United States Patent
Grodzki et al.

(10) Patent No.: US 9,835,706 B2
(45) Date of Patent: Dec. 5, 2017

(54) METHOD AND APPARATUS TO ACQUIRE MAGNETIC RESONANCE IMAGE DATA

(71) Applicant: Siemens Aktiengesellschaft, Munich (DE)

(72) Inventors: David Grodzki, Erlangen (DE); Carsten Prinz, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 507 days.

(21) Appl. No.: 14/509,436

(22) Filed: Oct. 8, 2014

(65) Prior Publication Data

US 2015/0097562 A1    Apr. 9, 2015

(30) Foreign Application Priority Data

Oct. 8, 2013 (DE) .................. 10 2013 220 288

(51) Int. Cl.
*G01V 3/00* (2006.01)
*G01R 33/54* (2006.01)
*G01R 33/30* (2006.01)
*G01R 33/36* (2006.01)

(52) U.S. Cl.
CPC ......... *G01R 33/543* (2013.01); *G01R 33/307* (2013.01); *G01R 33/3664* (2013.01)

(58) Field of Classification Search
CPC .............. G01R 33/543; G01R 33/5659; G01R 33/3415; G01R 33/36; A61B 5/055
USPC .......................................................... 324/309
See application file for complete search history.

(56) References Cited

U.S. PATENT DOCUMENTS

| | | | |
|---|---|---|---|
| 5,450,010 A | 9/1995 | Van Der Meulen et al. | |
| 6,249,120 B1* | 6/2001 | McKinnon | G01R 33/54 324/300 |
| 2009/0240379 A1* | 9/2009 | Feiweier | A61B 6/586 700/295 |

(Continued)

FOREIGN PATENT DOCUMENTS

| | | |
|---|---|---|
| JP | 2650585 B2 | 9/1997 |
| JP | 2006255189 A | 9/2006 |
| WO | 2014033591 A1 | 3/2014 |

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a method and apparatus to acquire magnetic resonance image data, an examination subject is positioned in a magnetic resonance apparatus to acquire magnetic resonance image data of the examination subject with a magnetic resonance sequence, and sequence parameters of the magnetic resonance sequence are established. First control commands of the magnetic resonance sequence are generated using the established sequence parameters. The first control commands are optimized so as to generate an optimized magnetic resonance sequence, the optimization of the first control commands including a conversion of the first control commands into optimized control commands. A test to review the optimized magnetic resonance sequence is implemented, the test including a comparison of the first control commands with the optimized control commands. The optimized magnetic resonance sequence is executed to acquire the magnetic resonance image data with the optimized control commands depending on the result of the test.

7 Claims, 3 Drawing Sheets

(56) References Cited

U.S. PATENT DOCUMENTS

| | | | |
|---|---|---|---|
| 2010/0274118 A1* | 10/2010 | Arnold | G01R 33/54 600/410 |
| 2012/0010495 A1 | 1/2012 | de Oliveira et al. | |
| 2012/0224757 A1 | 9/2012 | Gross | |
| 2012/0280686 A1* | 11/2012 | White | G01R 33/48 324/309 |
| 2013/0249551 A1 | 9/2013 | Kuehn | |
| 2013/0285654 A1 | 10/2013 | Feiweier et al. | |
| 2014/0232396 A1 | 8/2014 | Grodzki et al. | |

* cited by examiner

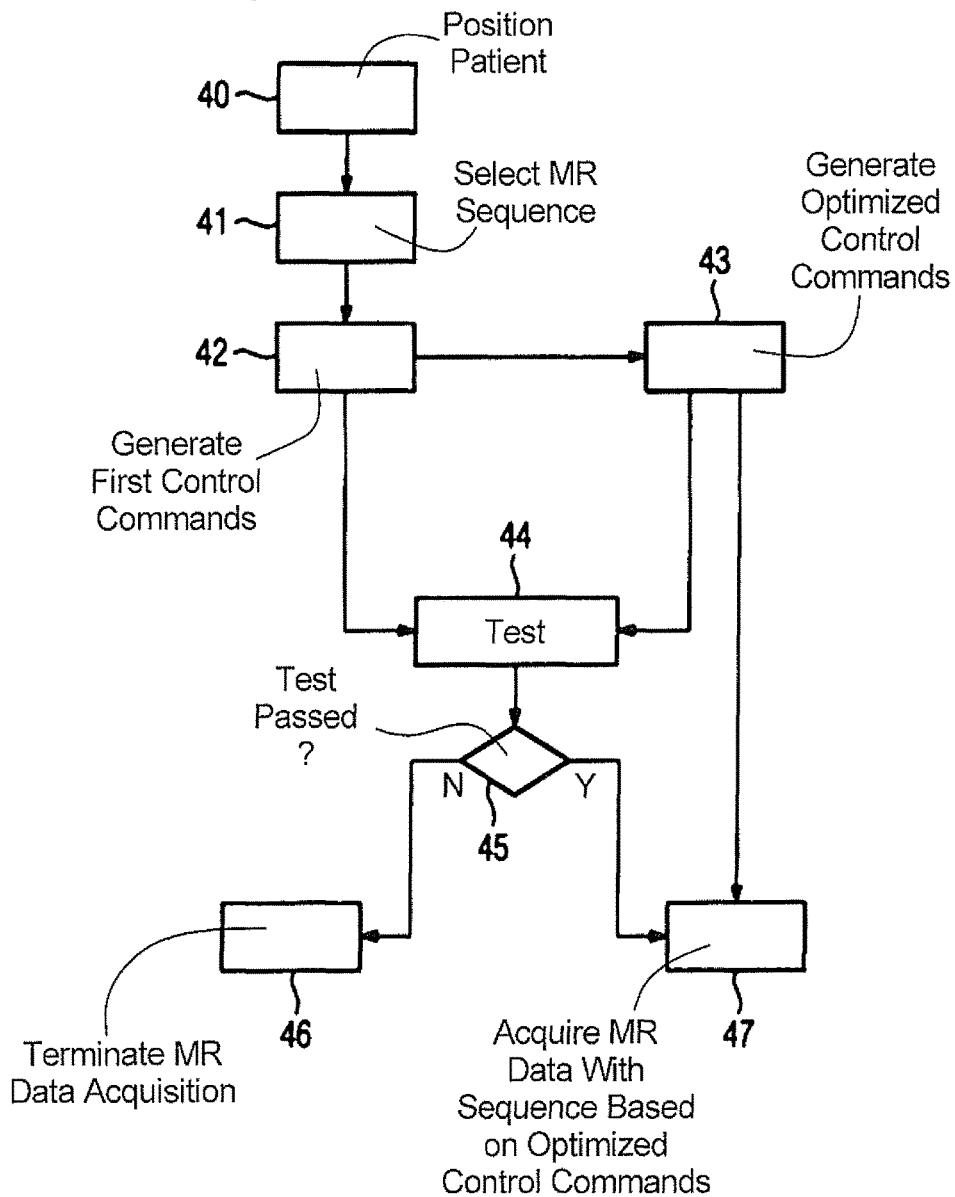

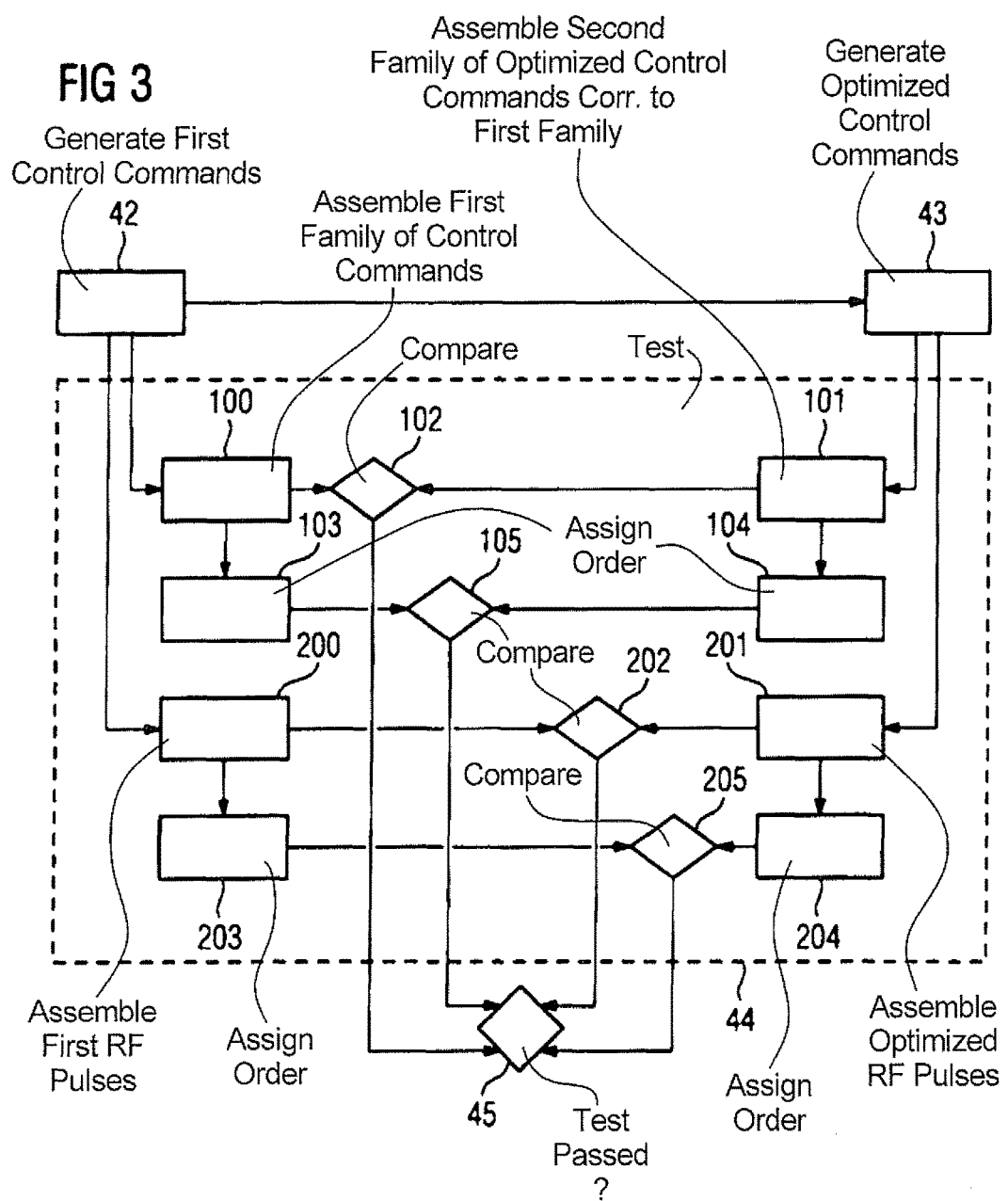

METHOD AND APPARATUS TO ACQUIRE MAGNETIC RESONANCE IMAGE DATA

BACKGROUND OF THE INVENTION

Field of the Invention

The invention concerns a method to acquire magnetic resonance image data, as well as a magnetic resonance apparatus designed to implement such a method, and a non-transitory, computer-readable data storage medium that is encoded with programming instructions that, when executed by a control computer of a magnetic resonance apparatus, cause such a method to be implemented.

Description of the Prior Art

The acquisition of magnetic resonance image data by operation of a magnetic resonance apparatus is controlled by magnetic resonance sequences. The magnetic resonance sequences include control commands that, for example, establish the gradient switchings (activations) of the magnetic resonance apparatus and the application of radio-frequency pulses by means of the magnetic resonance apparatus during the acquisition of the magnetic resonance image data. The magnetic resonance sequences furthermore include information about the chronological workflow of the control commands.

SUMMARY OF THE INVENTION

An object of the present invention is to enable an effective review of an optimized magnetic resonance sequence.

This object is achieved in accordance with the invention by a method to acquire magnetic resonance image data with the following steps.

An examination subject is positioned in a magnetic resonance apparatus to acquire magnetic resonance image data of the examination subject with a magnetic resonance sequence, and sequence parameters of the magnetic resonance sequence are established. First control commands of the magnetic resonance sequence are generated using the established sequence parameter. The first control commands are optimized so as to generate an optimized magnetic resonance sequence, the optimization of the first control commands including a conversion of the first control commands into optimized control commands. A test is implemented to review the optimized magnetic resonance sequence, the test including a comparison of the first control commands with the optimized control commands. The optimized magnetic resonance sequence is executed to acquire the magnetic resonance image data with the optimized control commands depending on the result of the test.

The establishment of the sequence parameters typically occurs after the positioning of the examination subject in the magnetic resonance apparatus. The examination subject can be a patient, a training personnel or a phantom. The examination subject is typically positioned within the tunnel-shaped opening of the magnetic resonance apparatus (the patient accommodation region) on a patient support device. The establishment of the sequence parameters can include the selection of a magnetic resonance sequence to acquire the magnetic resonance image data. The establishment of the sequence parameters can include the establishment of settings of the selected magnetic resonance sequence. Possible settings are, for example, the slice thickness or the field of view. The selection of the magnetic resonance sequence and the establishment of the sequence parameters can be implemented by a user.

The first control commands are typically generated automatically after the selection of the magnetic resonance sequence and the establishment of the sequence parameters. The first control commands are typically designed such that they control the execution of the selected magnetic resonance sequence with the established sequence parameters. For example, the first control commands can include instructions to the magnetic resonance apparatus which describe the point in time, the duration and the strength of gradient switchings of the magnetic resonance apparatus in the x-, y- and z-directions during the acquisition of the magnetic resonance image data. The first control commands can also include instructions to the magnetic resonance apparatus which describe the point in time and/or the duration of the acquisition of the magnetic resonance image data (i.e. the design of acquisition windows) and/or the point in time and/or the duration and/or the strength of radio-frequency pulses. The first control commands can include additional instructions to the magnetic resonance apparatus, for example frequency settings or phase settings of the magnetic resonance sequence or possible synchronization events.

The optimization of the first control commands typically takes place after the generation of the first control commands. The first control commands can be intercepted before they are passed to the magnetic resonance apparatus for execution. An optimization of the first control commands is then typically implemented, for example an optimization of the gradient switchings to reduce the noise volume of the magnetic resonance apparatus during the acquisition of the magnetic resonance image data. The optimized control commands generated during the optimization can then be passed to a test unit for review by means of the test before the optimized control commands are relayed again to the magnetic resonance apparatus for execution. This process typically runs automatically.

The test to review the optimized magnetic resonance sequence with the optimized control commands is typically also designated as a unit test. The test can be implemented after the optimization of the first control commands. The test can also be implemented during the optimization of the first control commands, wherein the test then checks the already optimized control commands. However, the test is typically finished only after the optimization of the first control commands has taken place. The test advantageously checks that no unwanted errors have occurred during the optimization of the first control commands. The test can check that no control commands have been deleted during the optimization of the first control commands, such that all control commands are retained after the optimization of the first control commands. The test can also check that the optimized control commands correspond to the first control commands with regard to the execution times. The test can thereby possibly separately check different types of control commands. The test can be implemented automatically.

The result of the test can include a statement about the result of the comparison of the first control commands with the optimized control commands. The result of the test can include information about in which parameters the optimized control commands coincide with the first control commands and/or whether the number of the optimized control commands coincides with the number of the first control commands. The execution of the magnetic resonance sequence can begin after the implementation of the test has concluded. The execution of the magnetic resonance sequence can then assume that a test has been passed. The execution of the magnetic resonance sequence can also already begin before the conclusion of the test. The execution of the magnetic resonance sequence can be terminated if the test is not passed and/or turns out to have not passed. The magnetic resonance image data acquired by means of the optimized magnetic resonance sequence can also be discarded if the test turns out to not have passed. The test is typically passed if the test establishes no unwanted deviations of the optimized control commands from the first control commands. The test can also be passed if the first control commands coincide with the optimized control commands within defined parameters.

The first control commands can be stored in a first database, wherein the comparison of the first control commands with the optimized control commands during the implementation of the test includes a loading of the first control commands from the first database. The optimized control commands can likewise be stored in a second database, wherein the comparison of the first control commands with the optimized control commands during the implementation of the test includes a loading of the optimized control commands from the second database.

A passed test will typically confirm the correct optimization of the first control commands. A passed test can therefore confirm the correct functionality of the optimization unit which implements the optimization of the first control commands. The proposed test thus contributes to the fact that the validity of the magnetic resonance image data acquired by means of the optimized magnetic resonance sequence is ensured. The test can prevent errors in the acquisition of the magnetic resonance image data due to an incorrect optimization of the first control commands.

In an embodiment, the first control commands are grouped into first families of first control commands, and the optimized control commands are grouped into second families of optimized control commands. The test includes a comparison of the first control commands of a first family with the optimized control commands of a second family. The first and second family hereby correspond to one another. In particular, the first control commands of multiple families are thereby compared with the optimized families of respective corresponding families. The first control commands are thereby advantageously to be assembled into first families in the same manner that the optimized control commands are assembled into second families. Possible families of control commands are gradient switchings in the x-direction, gradient switchings in the y-direction, gradient switchings in the z-direction, radio-frequency pulses, acquisition windows, frequency settings, phase settings and synchronization events. Naturally, additional families of control commands are conceivable. Each original control command is typically associated with a first family while each optimized control command is typically associated with a second family. The test will then advantageously only compare the first control commands of a first family with the optimized control commands of a corresponding second family. A second family of control commands thereby corresponds to a first family of control commands if both families of control commands include the same type of control commands. For example, it is thus ensured that only the first gradient switchings in the x-direction are compared with the optimized gradient switchings in the x-direction, and gradient switchings in the x-direction are possibly not compared with radio-frequency pulses. The control commands also can be grouped across families in chronologically successive blocks. A block can then include multiple control commands of possible different families. The test can then be implemented for a block after the optimization of that block. With such a block-by-block comparison of the first control commands with the optimized control commands, it also makes sense again to compare the control commands separately in the respective families.

One embodiment provides that the implementation of the test includes a comparison of the number of first control commands with the number of optimized control commands. The comparison of the number of first control commands with the number of optimized control commands can include that a check is made that the number of first control commands is identical to the number of optimized control commands. The test is then typically considered to be passed if the number of first control commands is equal to the number of optimized control commands. The test is then typically considered to not be passed if the number of first control commands deviates from the number of optimized control commands. This is advantageous since a deviation of the number of optimized control commands from the number of first control commands can supply an indication of an error in the optimization of the first control commands. The number of first control commands is typically compared with the number of optimized control commands within the families of control commands. The number of first control commands of a first family can thus be compared with the number of optimized control commands of the corresponding second family. This comparison can be repeated for each family of control commands.

In another embodiment, a first set of consecutive numbers is assigned to the first control commands, and a second set of consecutive numbers is assigned to the optimized control commands. The implementation of the test includes a comparison of one property of a first control command with the corresponding property of an optimized control command. The optimized control command hereby has a consecutive number which corresponds to the consecutive number of the first control command. In particular, the implementation of the test includes a comparison of multiple properties. In particular, the implementation of the test includes a comparison of a property of multiple control commands with corresponding consecutive numbers. One set of consecutive numbers can be assigned to control commands such that the control commands are numbered consecutively according to their control order. In particular, within a family a set of consecutive numbers can be assigned to the control commands of the family. For each family, a set of consecutive numbers can then be specifically assigned to the control commands of the family. The implementation of the test can then include that only the properties of first control commands and optimized control commands which have a corresponding consecutive number (in particular within a family) are compared. The correspondence of consecutive numbers in particular means that the continuous numbers are the same. By assigning consecutive numbers it is ensured that, in the comparison of the properties of control commands, only the control commands that correspond with regard to the order are compared with one another.

In another embodiment, the implementation of the test includes a comparison of the absolute times of the first control commands with the absolute times of the optimized control commands. What is typically meant by the absolute time is a time duration that characterizes the time which passes between the start of the magnetic resonance sequence and the application of the control commands. The absolute time is that time which passes between the start of the magnetic resonance sequence and the application of the control commands. The absolute times of the first control commands of a first family are advantageously compared again with the absolute times of the optimized control commands of the corresponding second family. Advantageously, only the absolute times of control commands are compared with corresponding (in particular identical) consecutive numbers. The absolute time can thus be an aforementioned property. The comparison of the absolute times of the first control commands and optimized control commands is advantageous if the optimization of the first control commands leaves the absolute times of the first control commands unchanged as a condition. As an alternative to the comparison of the absolute times, or in addition to the comparison of the absolute times, the length of the control commands can also be compared among one another. Furthermore, the dwell times—the times which pass given the acquisition of lines in k-space—of the acquisition window can furthermore also be compared with one another.

The image data acquisition unit according to the invention has a computer that is designed to execute a method according to the invention. The image data acquisition unit according to the invention is thus designed to implement a method to acquire magnetic resonance image data. The image data acquisition unit is designed to position an examination subject in a magnetic resonance apparatus to acquire the magnetic resonance image data of the examination subject by means of a magnetic resonance sequence and to establish sequence parameters of said magnetic resonance sequence. The computer of the image data acquisition unit is designed to generate first control commands of the magnetic resonance sequence using the established sequence parameters. The image data acquisition unit has an optimization unit which is designed to optimize the first control commands to generate an optimized magnetic resonance sequence, wherein the optimization of the first control commands includes a conversion of the first control commands into optimized control commands. The image data acquisition unit has a testing unit that is designed to implement a test to review the optimized magnetic resonance sequence, wherein the test includes a comparison of the first control commands with the optimized control commands. Furthermore, the image data acquisition unit is designed to execute the optimized magnetic resonance sequence to acquire the magnetic resonance image data with the optimized control commands, depending on the result of the test. The image data acquisition unit can have additional control commands which are necessary and/or advantageous for execution of a method according to the invention. The image data acquisition unit is also designed to transmit control signals to the magnetic resonance apparatus and/or to receive and/or process control signals in order to execute a method according to the invention. For this, computer programs and additional software can be stored in a memory unit of the image data acquisition unit, by means of which computer programs and additional software a processor of the image data acquisition unit automatically controls and/or executes a method workflow of a method according to the invention. The image data acquisition unit thus ensures the correct functionality of an optimization of a magnetic resonance sequence.

According to one embodiment, the image data acquisition unit is designed such that the first control commands are grouped into first families of first control commands and the optimized control commands are grouped into second families of optimized control commands, wherein the test includes a comparison of the first control commands of a first family with the optimized control commands of a second family, wherein first and second families correspond to one another.

According to another embodiment, the image data acquisition unit is designed such that the implementation of the test includes a comparison of the number of first control commands with the number of optimized control commands.

According to another embodiment, the image data acquisition unit is designed such that a first set of consecutive numbers is assigned to the first control commands and a second set of consecutive numbers is assigned to the optimized control commands, wherein the implementation of the test includes a comparison of one property of a first control command with the corresponding property of an optimized control command, wherein the optimized control command has a consecutive number which corresponds to the consecutive number of the first control command.

According to another embodiment, the image data acquisition unit is designed such that the implementation of the test includes a comparison of the absolute times of the first control commands with the absolute times of the optimized control commands.

The magnetic resonance apparatus according to the invention has an image data acquisition unit. The magnetic resonance apparatus according to the invention is designed to execute a method according to the invention with the image data acquisition unit. The image data acquisition unit can also be installed separately from the magnetic resonance apparatus. The image data acquisition unit can be connected with the magnetic resonance apparatus. Embodiments of the magnetic resonance apparatus according to the invention are designed analogous to the embodiments of the method according to the invention. The magnetic resonance apparatus can thus ensure the correct functionality of an optimization of a magnetic resonance sequence.

The present invention also encompasses a non-transitory, computer-readable data storage medium encoded with programming instructions that, when the storage medium is loaded into a control computer of a magnetic resonance apparatus, cause the magnetic resonance apparatus to be operated in order to implement any or all of the above-described embodiments of the method.

The method according to the invention can thereby be executed so as to be identically repeatable and robust. The computer program product is thus configured so that it can execute the method steps according to the invention by means of the computer. The computer needs to have, for example, a working memory, a graphics card or a logic unit, so that the respective method steps can be executed efficiently.

Examples of electronically readable data media are a DVD, a magnetic tape or a USB stick on which is stored electronically readable control information, in particular software (see above).

BRIEF DESCRIPTION OF THE DRAWINGS

FIG. 2 is a flowchart of an embodiment of the method according to the invention.

FIG. 3 is a flowchart of an embodiment of a test that can be implemented in the method according to the invention.

DESCRIPTION OF THE PREFERRED EMBODIMENTS

Figure 1:
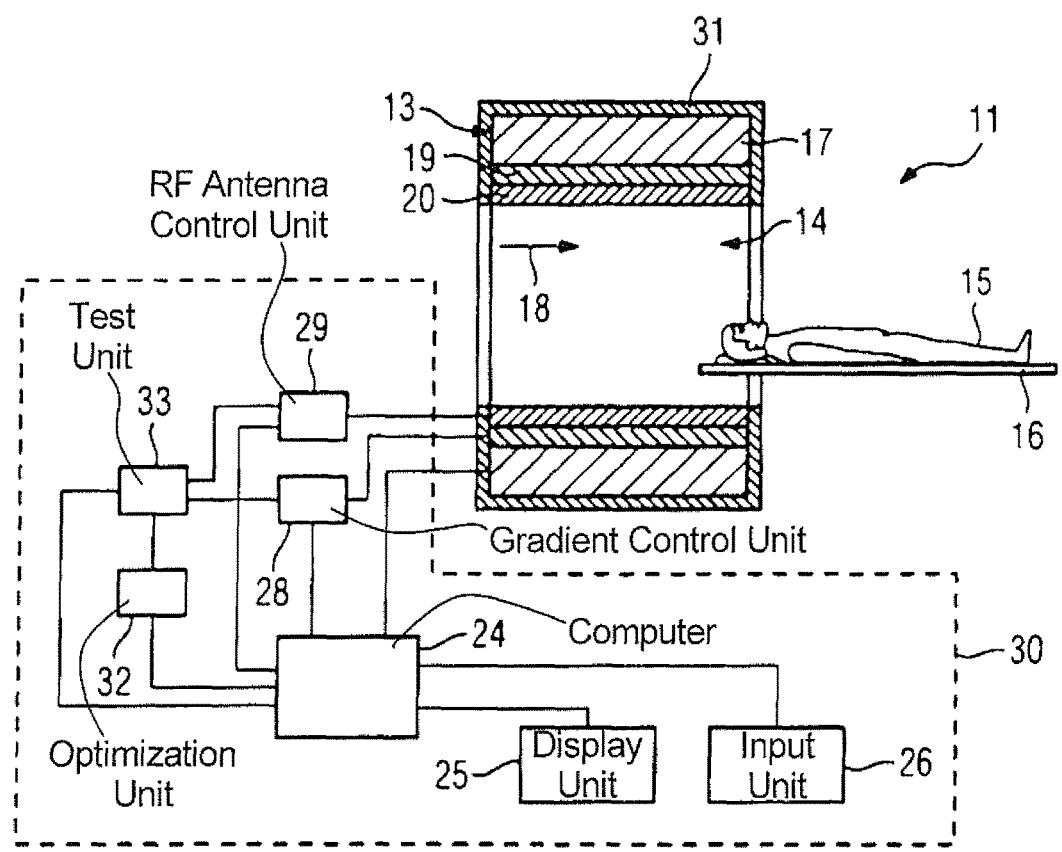
FIG. 1 schematically illustrates a magnetic resonance apparatus according to the invention for execution of a method according to the invention.

FIG. 1 schematically depicts a magnetic resonance apparatus 11 according to the invention for the execution of a method according to the invention. The magnetic resonance apparatus 11 comprises a detector unit (formed by a magnet unit or scanner 13) with a basic magnet 17 to generate a strong and in particular constant basic magnetic field 18. In addition, the magnetic resonance apparatus 11 has a cylindrical patient accommodation region 14 to receive a patient 15, wherein the patient accommodation region 14 is cylindrically enclosed in a circumferential direction by the magnet unit 13. The patient 15 can be slid into the patient accommodation region 14 by a patient support device 16 of the magnetic resonance apparatus 11. For this the patient bearing device 16 has a recumbent table that is arranged so as to be movable within the magnetic resonance apparatus 11. The magnet unit 13 is externally shielded by means of a housing casing 31 of the magnetic resonance apparatus 11.

The magnet unit 13 furthermore has a gradient coil unit 19 to generate magnetic field gradients that are used for a spatial coding during an imaging. The gradient coil unit 19 is controlled by a gradient control unit 28. Furthermore, the magnet unit 13 has: a radio-frequency (RF) antenna unit 20 which, in the shown case, is designed as a body coil permanently integrated into the magnetic resonance apparatus 11; and a radio-frequency (RF) antenna control unit 29 to excite a polarization that appears in the basic magnetic field 18 generated by the basic magnet 17. The radio-frequency antenna unit 20 is controlled by the radio-frequency antenna control unit 29 and radiates radio-frequency magnetic resonance sequences into the examination space that is essentially formed by the patient accommodation region 14.

The magnetic resonance apparatus 11 has a computer 24 to control the basic magnet 17, the gradient control unit 28 and the radio-frequency antenna control unit 29. The computer 24 centrally controls the magnetic resonance apparatus 11, for example, the implementation of a predetermined imaging gradient echo sequence. Control information (for example imaging parameters) as well as reconstructed magnetic resonance images can be displayed at a display unit 25 (for example on at least one monitor) of the magnetic resonance apparatus 11 for an operator. In addition to this, the magnetic resonance apparatus 11 has an input unit 26 by which information and/or parameters can be input by an operator during a measurement process. The computer 24 can directly pass control commands to the gradient control unit 28 and the radio-frequency antenna control unit 29.

Furthermore, the shown magnetic resonance apparatus 11 has an image data acquisition unit 30. The image data acquisition unit 30 has the aforementioned computer 24, the input unit 25, the display unit 26, the gradient control unit 28 and the radio-frequency antenna control unit 29. The image data acquisition unit 30 additionally has an optimization unit 32 to optimize control commands and a test unit 33 to check optimized control commands.

The shown magnetic resonance apparatus 11 can naturally include additional components that magnetic resonance apparatuses 11 conventionally have. A general functionality of a magnetic resonance apparatus 11 is additionally known to those skilled in the art, such that a more detailed description of the additional components is not necessary herein.

FIG. 2 shows a workflow diagram of an embodiment of a method according to the invention. In a first method step 40, a patient 15 is positioned on the patient support device 16 of the magnetic resonance apparatus 11. In a further method step 41, a user selects a magnetic resonance sequence by means of the input unit 26 and establishes sequence patient accommodation regions for this magnetic resonance sequence. In a further method step 42, the computer 24 automatically generates first control commands using the established sequence parameters, which first control commands enable an execution of the selected magnetic resonance sequence with the established sequence parameters. In a further method step 43, the first control commands are passed from the computer 24 to the optimization unit 32 and optimized by said optimization unit 32. Optimized control commands are thereby generated from the first control commands. For example, the first control commands are optimized such that the gradient switchings of the magnetic resonance sequence are optimized such that the noise volume of the magnetic resonance apparatus 11 is reduced during the acquisition of the magnetic resonance sequence. In a further method step 44, a test is implemented by the testing unit 33, for which the optimized control commands are passed from the optimization unit 32 to the testing unit 33 and the first control commands are passed from the computer 24 to the testing unit 33. The test compares the first control commands with the optimized control commands and, in a further method step 45, delivers a test result which describes whether the test has been passed or not passed. An example implementation of the test is shown in FIG. 3. If a test is not passed, in a further method step 46 the acquisition of the magnetic resonance sequence by the image acquisition unit 30 is terminated or is not even started in the first place. If the test is passed, in a further method step 47 the optimized magnetic resonance sequence is executed that includes, or is formulated according to, the optimized control commands by the magnetic resonance apparatus 11, in particular by the image data acquisition unit 30, wherein magnetic resonance image data are acquired. For this, the testing unit 33 passes the optimized control commands to the gradient control unit 28 and the radio-frequency antenna control unit 29.

FIG. 3 is a flowchart of an example of test in an embodiment of the method according to the invention. Only one example implementation of a possible test is described in detail, which test is implemented during the further method step 44 by the image data acquisition unit 30, in particular by means of the testing unit 33. The method steps 100-204 shown in FIG. 3, and the description associated with this that now follows, are thus only to be viewed as one possible embodiment of the test, as an example. The method steps 100-204 that are presented in FIG. 3 are implemented by means of the image data acquisition unit 30, in particular by the testing unit 33. For the test, the control commands are assembled into families of control commands. For better clarity, the case is shown in which the control commands are assembled into only two families, of which one family includes all gradient switchings in the x-direction and the other family includes all radio-frequency pulses. The control commands are typically assembled into more families than are shown. Possible additional families are gradient switchings in the y-direction, gradient switchings in the z-direction, acquisition windows, frequency settings, phase settings and synchronization events. The x-direction is thereby a direction orthogonal to the basic magnetic field 18. The y-direction is a direction orthogonal to the basic magnetic field 18 and orthogonal to the x-direction. The z-direction is a direction along the basic magnetic field 18.

The first control commands generated in a further method step 42 (see FIG. 2) and the control commands optimized in a further method step 43 (see FIG. 2) are a starting point. All first control commands that describe gradient switchings in the x-direction (i.e. first gradient switchings in the x-direction) are assembled into a first family in a further method step 100. Similarly, all optimized control commands that describe optimized gradient switchings in the x-direction (i.e. optimized gradient switchings in the x-direction) are assembled into a second family in a further method step 101. A comparison of the number of first gradient switchings in the x-direction and the number of optimized gradient switchings in the x-direction takes place in a further method step 102. Furthermore, in a further method step 103 consecutive numbers for the first family with the first gradient switchings in the x-direction are assigned according to the order of the gradient switchings in the x-direction. In the same sense, in a further method step 104 consecutive numbers for the optimized gradient switchings in the x-direction are assigned for the second family with the optimized gradient switchings in the x-direction. In a further method step 105, defined parameters of each gradient switching in the x-direction of the first family are compared with the corresponding parameters of those gradient switchings in the x-direction of the second family which respectively have the same consecutive number as the gradient switchings in the x-direction of the first family. Specifically, in the shown case the absolute times of the corresponding gradient switchings in the x-direction of the first and second family are compared in the further method step 105. The absolute times are the times between the start of the magnetic resonance sequence and the application of the gradient switchings in the x-direction.

In the same sense, for the radio-frequency pulses the first radio-frequency pulses are compared with optimized radio-frequency pulses in the method steps 200-205. For this, the first radio-frequency pulses are assembled again in a further method step 200 and the optimized radio-frequency pulses are assembled in a further method step 201. The number of first radio-frequency pulses is compared with the number of optimized radio-frequency pulses in a further method step 202. Consecutive numbers are again assigned to the first radio-frequency pulses in a further method step 203, and consecutive numbers are assigned to the optimized radio-frequency pulses in a further method step 204. In a further method step 205, the absolute times of the first radio-frequency pulses are compared with the absolute times of the optimized radio-frequency pulses, wherein the absolute times of first and optimized radio-frequency pulses with the same consecutive numbers are respectively compared.

To conclude the test, the results of the individual test results 102, 105, 202, 205 are assembled. The test is deemed to be passed in a further method step 45 (see FIG. 2) if all individual test results 102, 105, 202, 205 are passed. The individual test results 102, 202 are then thereby deemed to be passed if the number of first control commands and the number of optimized control commands are the same. The individual test results 105, 205 are then deemed to be passed if the absolute times of the first control commands and optimized control commands with the same consecutive numbers are identical.

The method steps of an embodiment of a method according to the invention that are presented in FIG. 2 and FIG. 3 are executed by the image data acquisition unit 30 together with the magnetic resonance apparatus 11. For this, the image data acquisition unit 30 comprises necessary software and/or computer programs that are stored in a memory unit of the image data acquisition unit 30. The software and/or computer programs include program means that are designed to execute the method according to the invention if the computer program and/or the software are executed in the image data acquisition unit 30 by means of a processor unit of the magnetic resonance apparatus 11.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to acquire magnetic resonance image data, comprising:

positioning an examination subject in a magnetic resonance apparatus having a control computer, and establishing sequence parameters for a magnetic resonance sequence that will be executed in order to operate the magnetic resonance apparatus so as to acquire magnetic resonance image data from the examination subject, said magnetic resonance sequence comprising a plurality of sequence events that must occur, and that must occur at respective times in said sequence relative to each other, in order for said sequence to be correctly executed;

in said control computer, using said established sequence parameters to automatically generate initial control commands of said magnetic resonance sequence, that cause said sequence events to occur, and to occur at said respective times;

in said control computer, automatically optimizing said initial control commands in order to generate an optimized magnetic resonance sequence that achieves an optimization goal, including conversion of said initial control commands into corresponding optimized control commands in said optimized magnetic resonance sequence;

in said control computer, automatically implementing a test to review said optimized magnetic resonance sequence independently of said optimization goal, including a comparison of said initial control commands with said optimized control commands, in order to determine whether any of said initial control commands were not converted into a corresponding optimized control command, and thereby generating a test result; and when said test result indicates no initial control command failed to be converted into said corresponding optimized control commands, emitting electronic signals from said control computer that represent said optimized magnetic resonance sequence in order to operate said magnetic resonance apparatus from said control computer with said optimized magnetic resonance sequence so as to acquire said magnetic resonance data from the examination subject.

2. A method as claimed in claim 1 comprising, in said control computer, grouping said initial control commands into a plurality of first families of initial control commands, and grouping said optimized control commands into a plurality of second families of optimized control commands and, in said test, comparing initial control commands of a first comparison family among said first families, with optimized control commands of a second comparison family among said second families of optimized control commands, said first comparison family and said second comparison family corresponding to each other.

3. A method as claimed in claim 1 comprising, in said test, comparing a number of said initial control commands with a number of said optimized control commands in order to determine whether those respective numbers equal each other.

4. A method as claimed in claim 1 comprising, in said control computer, assigning a first set of consecutive numbers to said initial control commands and assigning a second set of consecutive numbers to said optimized control commands and, in said test, comparing a property of a respective initial control command, having one of said consecutive numbers assigned to said initial control commands, with a property of a respective optimized control command having the same consecutive number as said respective initial control command.

5. A method as claimed in claim 1 comprising, in said test, comparing respective absolute times of occurrence, relative to a start of said magnetic resonance sequence, of said initial control commands, with respective absolute times of occurrence, relative to a start of said optimized magnetic resonance sequence, of said optimized control commands in order to determine whether said absolute times of said optimized control commands are the same as the absolute times of the initial control commands.

6. A magnetic resonance apparatus, comprising:
a magnetic resonance data acquisition unit in which an examination subject is situated;
a control computer configured to establish sequence parameters for a magnetic resonance sequence that will be executed in order to operate the magnetic resonance data acquisition unit so as to acquire magnetic resonance image data from the examination subject, said magnetic resonance sequence comprising a plurality of sequence events that must occur, and that must occur at respective times in said sequence relative to each other, in order for said sequence to be correctly executed;
said control computer being configured to use said established sequence parameters to automatically generate first control commands of said magnetic resonance sequence, that cause said sequence events to occur, and to occur at said respective times;
said control computer being configured to automatically optimize said initial control commands in order to generate an optimized magnetic resonance sequence that achieves an optimization goal, including conversion of said initial control commands into corresponding optimized control commands in said optimized magnetic resonance sequence;
said control computer being configured to automatically implement a test to review said optimized magnetic resonance sequence independently of said optimization goal, including a comparison of said initial control commands with said optimized control commands, in order to determine whether any of said initial control commands were not converted into a corresponding optimized control command, and thereby generating a test result; and
said control computer being configured, when said test result indicates no initial control command failed to be converted into said corresponding optimized control commands, to emit electronic signals from said control computer that represent said optimized magnetic resonance sequence in order to operate said magnetic resonance apparatus from said control computer with said optimized magnetic resonance sequence to acquire said magnetic resonance data from the examination subject.

7. A non-transitory, computer-readable data storage medium encoded with programming instructions, said data storage medium being loaded into a control computer of a magnetic resonance apparatus in which an examination subject is situated, and said programming instructions causing said control computer to:
establish sequence parameters for a magnetic resonance sequence that will be executed in order to operate the magnetic resonance apparatus so as to acquire magnetic resonance image data from the examination subject, said magnetic resonance sequence comprising a plurality of sequence events that must occur, and that must occur at respective times in said sequence relative to each other, in order for said sequence to be correctly executed;
use the established sequence parameters to generate initial control commands of said magnetic resonance sequence, that cause said sequence events to occur, and to occur at said respective times;
optimize said initial control commands in order to generate an optimized magnetic resonance sequence that achieves an optimization goal, including conversion of said initial control commands into corresponding optimized control commands in said optimized magnetic resonance sequence;
implement a test to review said optimized magnetic resonance sequence independently of said optimization goal, including a comparison of said initial control commands with said optimized control commands, in order to determine whether any of said initial control commands were not converted into a corresponding optimized control command, and thereby generate a test result; and
when said test result indicates no initial control command failed to be converted into said corresponding optimized control commands, emit electronic signals from said control computer that represent said optimized magnetic resonance sequence in order to operate said magnetic resonance apparatus from said control computer with said optimized magnetic resonance sequence to acquire said magnetic resonance data from the examination subject.

* * * * *